United States Patent [19]

Nguyen

[11] Patent Number: 5,410,189
[45] Date of Patent: Apr. 25, 1995

[54] INPUT BUFFER HAVING AN ACCELERATED SIGNAL TRANSITION

[75] Inventor: Hy V. Nguyen, San Jose, Calif.

[73] Assignee: Xilinx, Inc., San Jose, Calif.

[21] Appl. No.: 128,387

[22] Filed: Sep. 27, 1993

[51] Int. Cl.$^6$ .............................................. H03K 5/12
[52] U.S. Cl. .................................... 327/374; 327/170; 327/427
[58] Field of Search ................ 307/572, 573, 574, 575, 307/576, 263, 443

[56] References Cited

U.S. PATENT DOCUMENTS

| 4,783,607 | 11/1988 | Hsieh | 307/475 |
| 4,820,937 | 4/1989 | Hsieh | 307/475 |
| 5,055,714 | 10/1991 | Obregon | 307/263 |

Primary Examiner—William L. Sikes
Assistant Examiner—James A. Dudek
Attorney, Agent, or Firm—Jeanette S. Harms

[57] ABSTRACT

A CMOS buffer includes an input inverter, and a pull-up circuit coupled to the input inverter. The pull-up circuit provides an additional, temporary, signal pull-up on the output terminal of the input inverter during a high to low signal transition on its input terminal. The pull-up circuit includes a means for creating a signal delay. In one embodiment, the means for creating a signal delay includes a second and third inverter in series, the second inverter receiving an output signal from the input inverter. The pull-up circuit further includes two transistors for transferring a high signal to an output line of the input inverter. One transistor is controlled by a signal transferred by the means for creating a delay. The other transistor is controlled by an input signal to the input inverter. This pull-up circuit configuration ensures that the signal transition from low to high is substantially equal to the signal transition from high to low on the output line of the input inverter. The input inverter is then coupled to a driving circuit inverter to provide a CMOS buffer configuration.

17 Claims, 3 Drawing Sheets

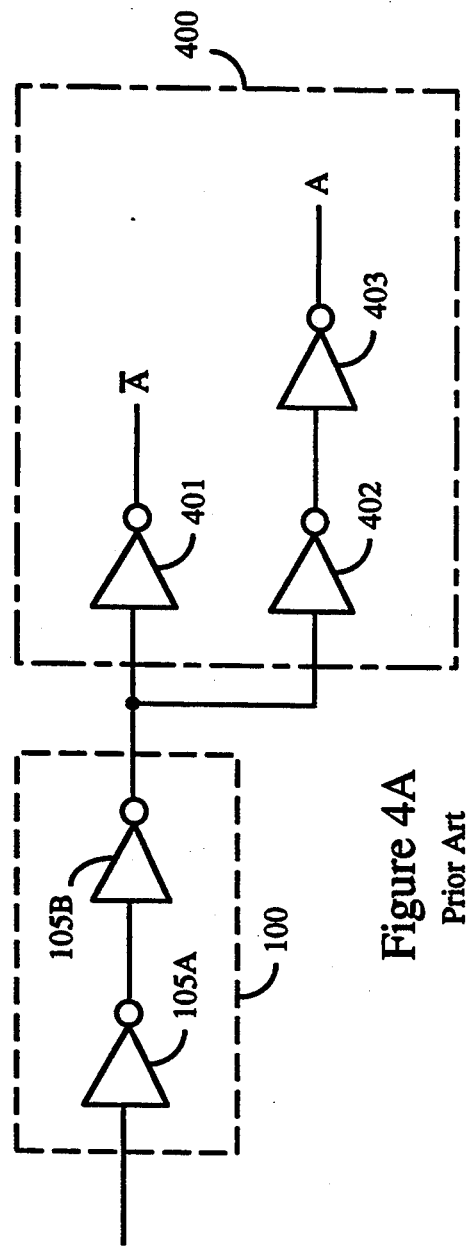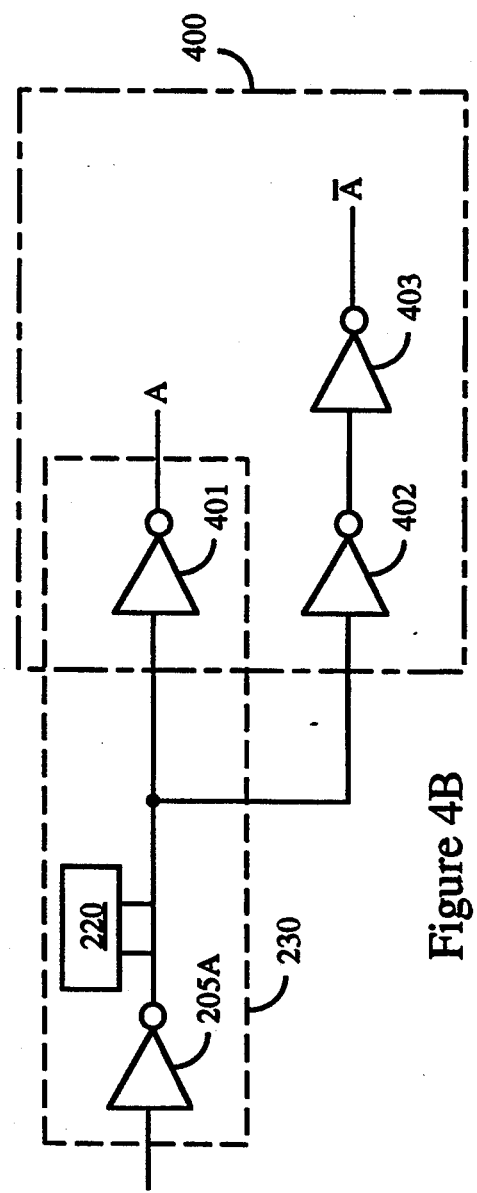
Figure 4A
Prior Art
Figure 4B

INPUT BUFFER HAVING AN ACCELERATED SIGNAL TRANSITION

BACKGROUND OF THE INVENTION

1. Field of the Invention

The present invention relates to an input buffer, and in particular to an input buffer providing substantially the same signal transition time from high to low as from low to high.

2. Description of the Related Art

Transistor-transistor-logic (TTL) operating characteristics are well known in the art. For example, a TTL low signal is typically any voltage under 0.8 volts, whereas a TTL high signal is typically any voltage over 2.0 volts, and the threshold voltage is about 1.5 volts. In many digital signal applications, CMOS devices require TTL compatible input buffers.

FIG. 1 illustrates a conventional TTL/CMOS input buffer 100 which includes two inverters 105A and 105B. Inverter 105A includes a p-type transistor 103 and an n-type transistor 104. If a low signal is provided at input terminal 101, this low signal turns on transistor 103, and turns off transistor 104. Because transistor 103 is on, a high signal, provided by voltage source Vcc, is transferred to node A. In contrast, if a high signal is provided at input terminal 101, this high signal turns on transistor 104, and turns off transistor 103. Because transistor 104 is on, this transistor pulls down the voltage on node A to ground. Inverter 105B has a similar configuration to inverter 105A and therefore is not described in detail. Thus, a high signal on input terminal 101 results in a high signal on output terminal 102.

To ensure buffer 100 exhibits a TTL 1.5 V threshold voltage, n-type transistor 104 is sized larger than p-type transistor 103. In fact, transistor 104 typically has a width (Wn) approximately four or five times greater than the width (Wp) of transistor 103 (assuming transistors 104 and 103 have the same channel length). For example, in one embodiment of buffer 100, transistor 104 has a width of 150 microns while transistor 103 has a width of 30 microns. However, this large width differential creates an imbalanced switching delay from input terminal 101 of inverter 105A to node A. Specifically, the high to low signal transition of inverter 105A (as measured at node A) is much faster than the signal transition from low to high. For example, in the embodiment shown in FIG. 1, the switching delay beginning when a signal at input terminal 101 switches from high to low and ending when the signal at node A switches from low to high is about 1.05 nanoseconds. In contrast, the switching delay beginning when a signal at input terminal 101 switches from low to high and ending when the signal at node A switches from high to low is about 440 picoseconds. Thus, a device time delay specification which includes input buffer 100 varies depending on signal transition. This variation in device time delay is highly undesirable because end users require a consistent time delay specification for application use.

To solve this problem, buffer 100 uses inverter 105B which is cascaded with inverter 105A to balance out the skew created by inverter 105A. Inverter 105B includes a p-type transistor 106 having a width of 30 microns and an n-type transistor 107 having a width of 45 microns. Because transistor 107 is slightly wider than transistor 106, transistor 107 is slightly stronger than transistor 106. Therefore, in a low to high signal transition at node A, transistor 107 accelerates pulling down the voltage provided at output terminal 102, thereby substantially compensating for the slower pull-up provided by transistor 103.

However, this solution generates an overall switching delay from input terminal 101 to output terminal 102 which is highly undesirable for many CMOS applications. Therefore, a need arises for a buffer which equalizes switching delays while at the same time minimizing the time delay between the input terminal and the output terminal.

SUMMARY OF THE INVENTION

In accordance with the present invention, an inverting, CMOS input buffer includes a first inverter and a pull-up circuit coupled to the first inverter. The pull-up circuit provides an additional, temporary, signal pull-up on the output terminal of the inverter during a high to low signal transition on the input terminal of the first inverter. The pull-up circuit includes a means for creating a signal delay such that the temporary pull-up occurs only for the duration of the signal delay.

In one embodiment, the means for creating a signal delay includes a second and third inverter in series, the second inverter receiving an output signal from the first inverter. The pull-up circuit further includes two transistors for transferring a high signal to the output terminal of the first inverter. The first transistor is controlled by a signal transferred by the means for creating a delay. The second transistor is controlled by an input signal to the first inverter. This pull-up circuit configuration ensures that the signal transition from low to high is substantially equal to the signal transition from high to low at the output terminal. The first inverter is then coupled to a driving circuit inverter to provide a CMOS buffer configuration.

In another embodiment, a CMOS input inverter further includes a third transistor and reference voltage circuit. During an input signal transition from high to low, the third transistor decreases the signal transition delay from low to high on the output terminal by providing an additional, temporary pull-up on the output line of the buffer. During a low input signal state, the reference voltage circuit provides an intermediate voltage on the output line of the buffer. In this manner, during an input signal transition from low to high, the first inverter rapidly pulls the intermediate signal on the output line to ground (in contrast to a full Vcc to ground transition). Therefore, the buffer in this embodiment accelerates the signal transition on the output terminal irrespective of whether the transition is from high to low or from low to high.

BRIEF DESCRIPTION OF THE INVENTION

FIG. 4A shows the prior art TTL/CMOS input buffer of FIG. 1 coupled to a conventional driving circuit.

FIG. 4B illustrates the input inverter of FIG. 2 coupled to a driving circuit in accordance with the present invention.

DETAILED DESCRIPTION OF THE DRAWINGS

Figure 1:
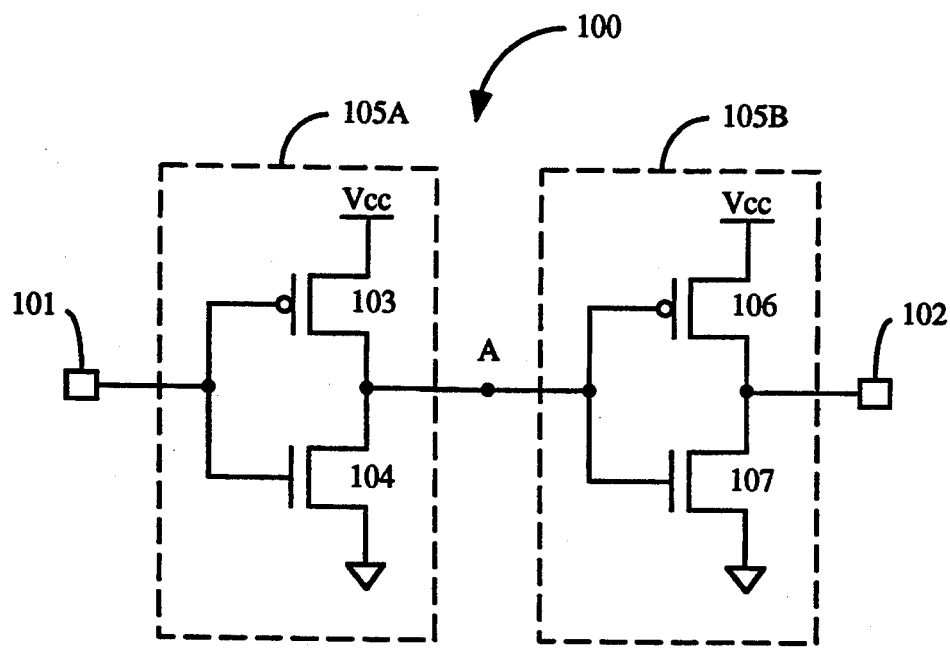
FIG. 1 illustrates a prior art buffer including two inverters.
Figure 2:
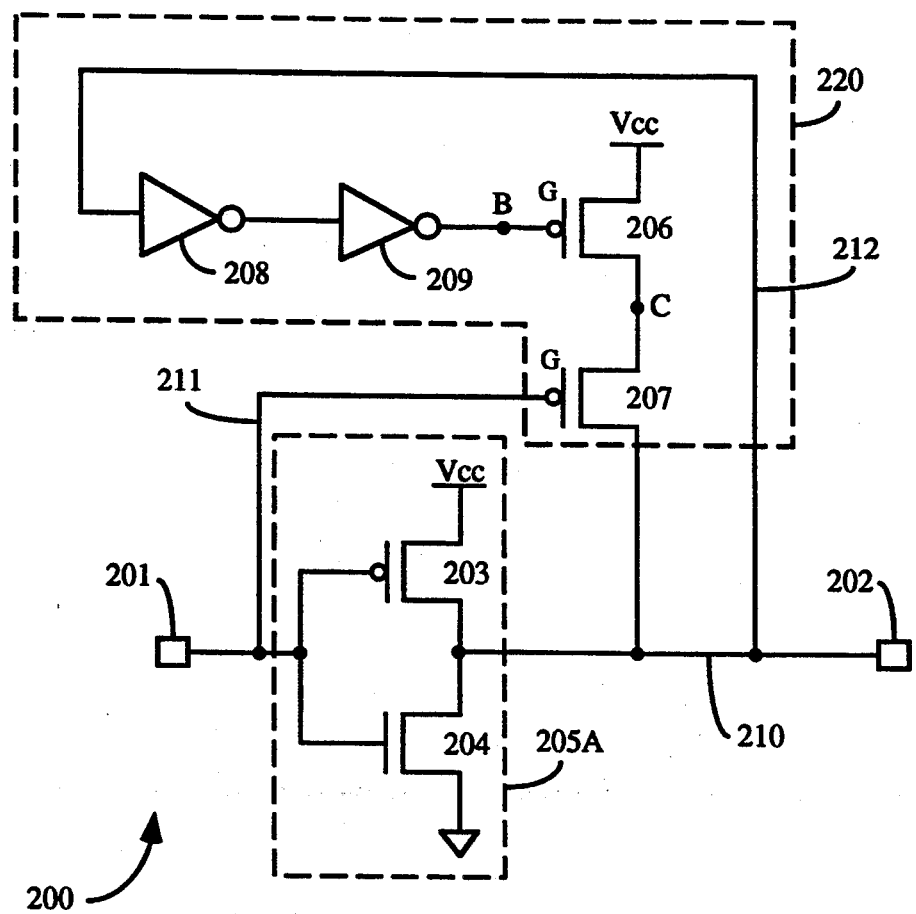
FIG. 2 shows an inverting buffer in accordance with the present invention.

FIG. 2 illustrates an inverting, input buffer 200 in accordance with the present invention which provides approximately the same delay at its output terminal irrespective of whether the input signal transition is from high to low or from low to high. Inverting buffer 200 includes an inverter 205A, having a p-type transistor 203 and an n-type transistor 204, and a pull-up circuit 220. In one embodiment, transistor 203 has a width of 30 microns and transistor 204 has a width of 150 microns (wherein both transistors have a length of 1.0 micron). In accordance with the present invention, pull-up circuit 220 accelerates the signal transition on output terminal 202 from low to high by providing an additional temporary signal pull-up.

Specifically, assume a steady state high signal is provided at input terminal 201. This high signal turns on transistor 204, and turns off transistor 203. Because transistor 204 is on, it pulls down the voltage on line 210 which is coupled to output terminal 202.

Output terminal 202 is further coupled to line 212. Thus, the low signal provided on output terminal 202 is inverted by inverter 208 and then reinverted by inverter 209. Therefore, a low signal is also provided to the gate G of p-type transistor 206. Inverters 208 and 209 are very small transistors. For example, in one embodiment, both inverters 208 and 209 include one p-type transistor having a width of 5 microns and one n-type transistor having a width of 4 microns (wherein all transistors have a length of 1.0 micron).

The low signal provided to the gate G of transistor 206 turns on this transistor, thereby transferring a high signal from voltage source Vcc to node C. However, in accordance with the present invention, line 211 is coupled between input terminal 201 and the gate G of p-type transistor 207. Thus, the high signal provided at input terminal 201 turns off transistor 207, thereby preventing any current flow through transistor 207.

During a high to low signal transition at input terminal 201, the low signal turns on transistor 203, and turns off transistor 204. Because transistor 203 is on, a high signal, provided by voltage source Vcc, is transferred to line 210. As noted previously, because transistor 203 is physically smaller than transistor 204, the low to high signal transition on output terminal 202 is inherently slower than the high to low signal transition. However, in accordance with the present invention, line 211 also provides the low signal on input terminal 201 to the gate G of transistor 207, thereby turning on this transistor.

As described above, the previous steady state turned on transistor 206, thereby transferring a high signal to node C. During the high to low signal transition, because transistor 207 is turned on, the high signal on node C is immediately transferred to line 210. Thus, the relatively slow signal transition provided by inverter 205A is supplemented by the high signal transferred by transistor 207, thereby accelerating the signal transition from low to high on line 210.

The high signal, provided by transistors 203, 206, and 207, is inverted by inverter 208 and reinverted by inverter 209. Thus, a high signal is eventually provided to the gate G of transistor 206, thereby turning off this transistor. Therefore, after the delay generated by inverters 205A, 208, and 209, the signal on line 210 is kept high solely by transistor 203.

The delay of the signal transition from low to high at output terminal 202 is adjusted by changing the size of transistor 207. In this embodiment, transistors 206 and 207 have widths of 100 microns and 80 microns, respectively (wherein each transistor has a length of 1.0 micron). Inverters 208 and 209, in addition to providing a delay in pull-up circuit 220, also provide a desirable, electrical isolation from inverter 205A. Moreover, using an even number of inverters, i.e. inverters 208 and 209, also prevents oscillation from occurring at node B.

In the embodiment shown in FIG. 2, the switching delay beginning at a high to low edge at input terminal 201 and ending at a low to high edge at output terminal 202 is about 550 picoseconds, whereas the switching delay beginning at a low to high edge at input terminal 201 and ending at a high to low edge at output terminal 202 is about 540 picoseconds. Thus, the overall speed gain compared to the prior art is at least 500 picoseconds (1.05 nanoseconds-0.55 nanoseconds).

Referring to FIG. 4A, prior art input buffer 100 is typically coupled to a driver circuit 400. Specifically, an output signal of inverter 105B is provided to both inverters 401 and 402. The output signal of inverter 402 is provided to inverter 403. In this manner, inverters 401 and 403 provide the complement and true signal A, respectively.

In accordance with the present invention, input inverter 200 shares another inverter, conventionally part of driver circuit 400, to form a non-inverting buffer configuration. Specifically, the output signal of inverter 205A is provided to inverters 401 and 402, wherein the output signal of inverter 402 is provided to inverter 403. Because inverters 205A and 401 form the input buffer 230, inverters 401 and 403 provide the true and complement of signal A, respectively.

Figure 3:
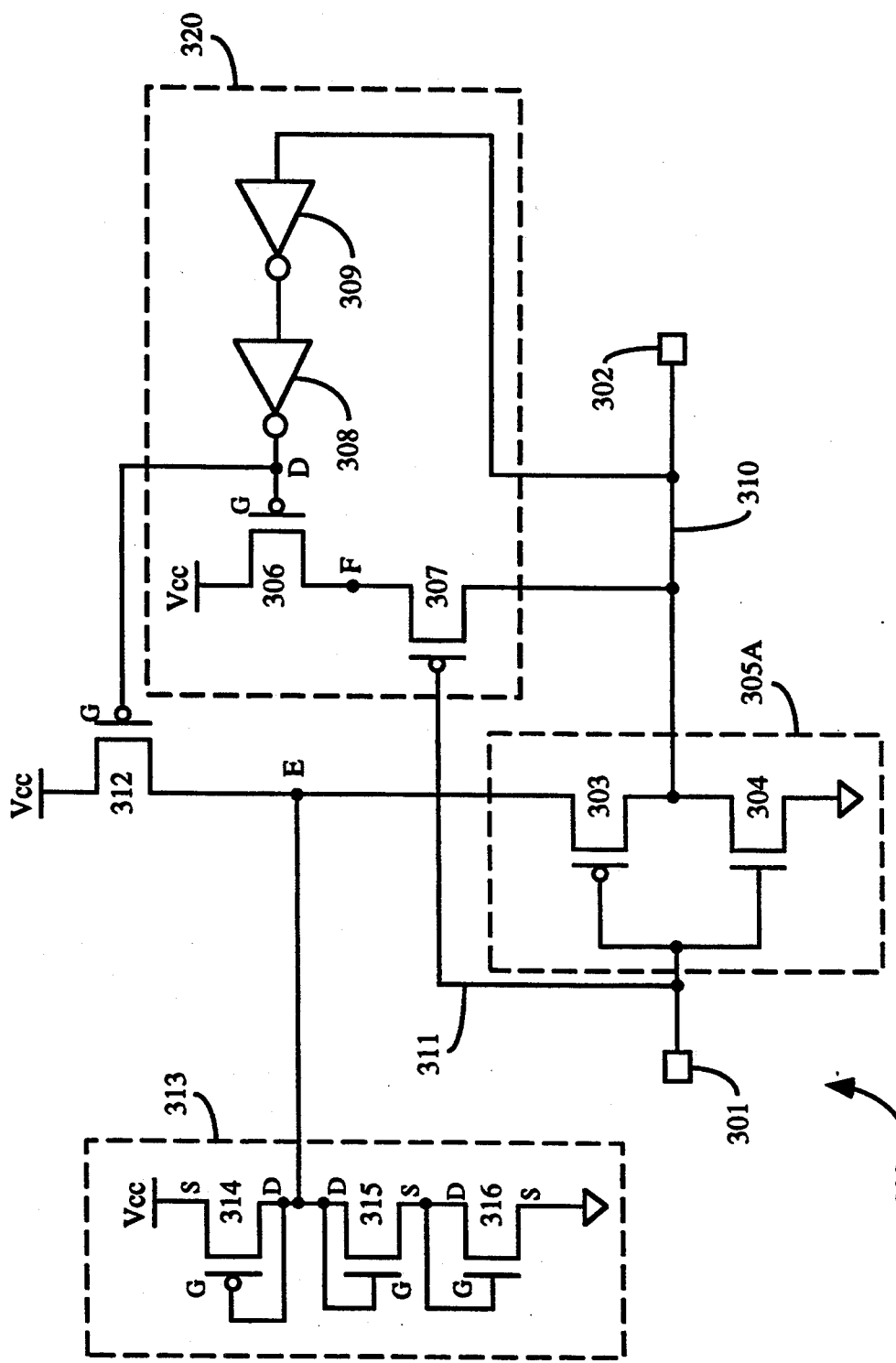
FIG. 3 illustrates another buffer in accordance with the present invention.

FIG. 3 illustrates another buffer 300 in accordance with the present invention which accelerates both transitions, i.e. from high to low and from low to high. In this embodiment, inverter 305A and pull-up circuit 320 function in a similar manner to inverter 205A and pull-up circuit 220 (FIG. 2) and, therefore, are not explained in detail herein. Note that inverter 305A, instead of being coupled directly to voltage source Vcc, is coupled to node E. Transistor 312 is coupled between voltage source Vcc and node E, wherein the gate G of transistor 312 is coupled to the gate G of transistor 306. Node E is further coupled to reference voltage source 313. In this embodiment, circuit 313 includes one p-type transistor 314, and two n-type transistors 315, 316. Transistor 314 has its gate G coupled to its drain D. Transistors 315 and 316 each have their gates G coupled to their drains D. In one embodiment, circuit 313 provides approximately 3 V to node E.

As explained in detail above, if the signal on input terminal 301 is high, the signal on output terminal 302 as well as on node D is low. This low signal turns on p-type transistors 306 and 312, thereby providing high signals on nodes E and F. However, because transistors 303 and 307 are off, the high signals on nodes E and F are not actively used during this state.

During an input signal transition from high to low, transistors 303 and 307 turn on, thereby transferring the stored high signals on nodes E and F to line 310. The delay of the signal transition on line 310 is adjusted in the present invention by varying the size of transistor 307, i.e. the larger transistor 307, the quicker the signal transition.

If the signal on output terminal 302 is high, the signal on node D is also high. This high signal turns off p-type transistors 306 and 312. Thus, the signal on line 310 then becomes solely a function of the reference voltage provided at node E. Therefore, the signal on line 310 decreases from Vcc to the predetermined reference voltage generated by circuit 313 (in this case, 3 V). The speed of the output signal transition from voltage Vcc to the predetermined reference voltage is a function of the delay created by inverters 308 and 309.

During a subsequent input signal transition from low to high, the high signal turns off transistors 303 and 307 and turns on transistor 304. Because transistor 304 is approximately four to five times larger than transistor 303, the signal on line 310 is quickly pulled to ground. Moreover, because the previous signal on line 310 is 3 V, instead of 5 V as provided by buffer 200 (FIG. 2), this signal transition occurs even more rapidly. Thus, buffer 300 accelerates the signal transition on output terminal 302 irrespective of whether the transition is from high to low or from low to high.

In one embodiment of the present invention, transistors 303, 304, 306, and 307 are sized identically to transistors 203, 204, 206, and 207 (FIG. 2) respectively. The sizes of other transistors are listed below in Table 1.

TABLE 1

| Transistor | Width | Length |
|---|---|---|
| 312 | 100 | 1.0 |
| 314 | 40 | 4.0 |
| 315 | 8 | 1.5 |
| 316 | 8 | 1.5 |

The embodiments described above are illustrative only and not limiting. Other embodiments will be apparent to those skilled in the art in light of the detailed description and figures. For example, the present invention is equally applicable to electrically programmable logic devices (EPLDs), electrically programmable read only memories (EPROMs), and electrically erasable programmable read only memories (EEPROMs). The present invention is set forth in the appended claims.

I claim:

1. A CMOS buffer comprising:
   an inverter having an input line and an output line; and
   a pull-up circuit coupled to said inverter, said pull-up circuit providing a simultaneous, temporary pull-up in combination with the pull-up provided by said inverter on said output line during a high to low signal transition on said input line.

2. The CMOS buffer of claim 1 wherein said pull-up circuit includes a means for creating a signal delay.

3. The CMOS buffer of claim 2 wherein said means for creating a signal delay includes two inverters.

4. The CMOS buffer of claim 2 wherein said means for creating a signal delay isolates said pull-up circuit from said inverter.

5. The CMOS buffer of claim 4 wherein said pull-up circuit further includes means for transferring a high signal to an output terminal of said buffer.

6. The CMOS buffer of claim 5 wherein said means for transferring said high signal includes a first transistor coupled to a voltage source and a second transistor coupled between said first transistor and said output terminal.

7. The CMOS buffer of claim 6 wherein said first transistor and said second transistor are p-type transistors.

8. The CMOS buffer of claim 7 wherein the gate of said first transistor is controlled by said means for creating a delay.

9. The CMOS buffer of claim 8 wherein the gate of said second transistor is controlled by an input signal to said buffer.

10. The CMOS buffer of claim 9 wherein an output signal from said inverter is provided to said means for creating a delay.

11. A CMOS buffer having an input terminal and an output terminal comprising:
    a first transistor having a gate, a source, and a drain, said source of said first transistor coupled to a first voltage source;
    a second transistor having a gate, a source, and a drain, said source of said second transistor coupled to a second voltage source, and said drain of said second transistor coupled to said drain of said first transistor, said gates of said first and second transistors coupled to said input terminal;
    a third transistor having a gate, a source, and a drain, said source of said third transistor coupled to said first voltage source;
    a fourth transistor having a gate, a source, and a drain, said source of said fourth transistor coupled to said drain of said third transistor, said drain of said fourth transistor coupled to said output terminal, and said gate of said fourth transistor coupled to said input terminal; and
    a delay device coupled between said output terminal and said gate of said third transistor.

12. The CMOS buffer of claim 11 wherein said second transistor is an n-type transistor and said first, third, and fourth transistors are p-type transistors.

13. The CMOS buffer of claim 12 wherein said delay device includes two inverters.

14. A CMOS buffer having an input terminal and an output terminal comprising:
    a first transistor having a gate, a source, and a drain;
    a second transistor having a gate, a source, and a drain, said source of said second transistor coupled to a first voltage source, and said drain of said second transistor coupled to said drain of said first transistor, said gates of said first and second transistors coupled to said input terminal;
    a third transistor having a gate, a source, and a drain, said source of said third transistor coupled to a second voltage source;
    a fourth transistor having a gate, a source, and a drain, said source of said fourth transistor coupled to said drain of said third transistor, said drain of said fourth transistor coupled to said output terminal, and said gate of said fourth transistor coupled to said input terminal;
    a fifth transistor having a gate, a source, and a drain, said source of said fifth transistor coupled to said second voltage source, said drain of said fifth transistor coupled to said source of said first transistor, and said gate of said fifth transistor coupled to said gate of said third transistor;
    a reference voltage source coupled between said first transistor and said fifth transistor; and
    a delay device coupled between said output terminal and said gate of said third transistor.

15. The CMOS buffer of claim 14 wherein said second transistor is an n-type transistor and said first, third, fourth, and fifth transistors are p-type transistors.

16. The CMOS buffer of claim 15 wherein said delay device includes two inverters.

17. A method of equalizing a signal transition on an output line of an input buffer comprising the steps of:

coupling a pull-up circuit to an output line of an input inverter; and providing a simultaneous, temporary pull-up with said pull-up circuit in combination with the pull-up provided by said input inverter on said output line during a low to high signal transition on said output line.

* * * * *